(12) United States Patent
Franzon et al.

(10) Patent No.: US 8,742,870 B2
(45) Date of Patent: Jun. 3, 2014

(54) RECONFIGURABLE FILTER APPARATUS

(75) Inventors: Bosse Franzon, Bro (SE); Daniel Källberg, Bromma (SE)

(73) Assignee: Optis Cellular Technology, LLC, Plano, TX (US)

( * ) Notice: Subject to any disclaimer, the term of this patent is extended or adjusted under 35 U.S.C. 154(b) by 443 days.

(21) Appl. No.: 13/062,743

(22) PCT Filed: Sep. 8, 2008

(86) PCT No.: PCT/SE2008/051001
§ 371 (c)(1),
(2), (4) Date: Mar. 8, 2011

(87) PCT Pub. No.: WO2010/027310
PCT Pub. Date: Mar. 11, 2010

(65) Prior Publication Data
US 2011/0169589 A1   Jul. 14, 2011

(51) Int. Cl.
*H03H 7/01* (2006.01)
*H01P 1/20* (2006.01)

(52) U.S. Cl.
CPC ............... *H03H 7/0161* (2013.01); *H01P 1/20* (2013.01)
USPC .......................................... 333/174; 333/202

(58) Field of Classification Search
CPC ................................ H03H 7/0161; H01P 1/20
USPC ........ 333/18, 24 R, 24.2, 132, 167, 174–176, 333/202
See application file for complete search history.

(56) References Cited

U.S. PATENT DOCUMENTS 5,184,096 A * 2/1993 Wakino et al. ................ 333/175
6,242,843 B1 * 6/2001 Pohjonen et al. ......... 310/313 R

* cited by examiner

*Primary Examiner* — Benny Lee
*Assistant Examiner* — Rakesh Patel
(74) *Attorney, Agent, or Firm* — Vincent J. Allen; Carstens & Cahoon, LLP (57) ABSTRACT

According to the teachings presented herein, a reconfigurable filter apparatus includes at least first and second passive filter sections connected in parallel to yield a composite filter response. Each passive filter section has a respective passband response and at least one of the passive filter sections is a 'de-tunable' passive filter section. Each de-tunable passive filter circuit includes a detuning circuit operable to exclude the respective passband response of the de-tunable passive filter section from the composite filter response by detuning a resonator within the de-tunable passive filter section. 'Detuning' the resonator can be understood as short-circuiting, opening the resonator, or otherwise disabling it, such that the filter path is blocked. Advantageously, the resonator(s) that are selectively detuned in this manner is isolated from input and output ports of the de-tunable passive filter section with respect to frequencies outside of the respective passband response of the de-tunable passive filter section.

12 Claims, 5 Drawing Sheets

RECONFIGURABLE FILTER APPARATUS

TECHNICAL FIELD

The present invention generally relates to electrical/electronic filters, and particularly relates to reconfigurable filters.

BACKGROUND

No exaggeration attends the statement that filters represent one of the most important elements in electrical and electronic technologies. Filtering plays critical roles in noise and interference suppression, and in signal conditioning and discrimination. Communication systems employ a staggering variety of filter types, from passive analog filters used for high-power signals in base station antenna systems, to digital filters used for low-power signals in demodulation and decoding circuitry. The particular challenges and complexities that arise in filter design and implementation vary with filter type and application.

For example, "tunable" filters or filters that are otherwise adjustable pose potentially significant design and implementation challenges. For example, "active" electronic filters offer significant opportunities for adjustable and dynamic reconfiguration, but it may be impractical or even impossible to implement active filters at very high power levels, and/or for higher radio frequency and microwave applications.

U.S. Pat. No. 5,987,304 to Lätt illustrates an active amplifier chain that is configured to provide a variable bandwidth filter for use in a mobile telephone repeater. The amplifier chain includes a filter device that has a series of bandpass filters that have controllable, overlapping passbands. Active mixer circuits (oscillators) provide passband variability in flexible fashion, but their use imposes practical limits on the signal frequencies and power levels at which the filter can be used.

Use of electromechanical systems and passive filter elements provides for adjustability, even with higher power levels and higher frequencies, but such implementations are not without their own disadvantages. For example, filters with tunable center frequencies may be realized by implementing series filter stages with tunable resonators. These tunable resonators may be conductive rods (quarter-wave coaxial resonators) that are capacitively loaded at their open ends with conductive, asymmetrical disks mounted on mechanically-turned shafts (or as stepper-motor actuated disks). However, the expense and complication of such electromechanical arrangements is self-evident, and it can be difficult to achieve good return loss across the desired tuning range, particularly without the addition of isolation stages between individually tunable filter stages.

In another approach, mechanical switches allow for the selection of individual filters from among a set of filters, each one of which can be optimized according to a desired filter response. So-called switched filter banks represent one implementation, where one or more filters in a set of filters are switched into electrical connectivity with input and output filter ports using respective input and output switches. The switches generally are multi-pole/single-throw switches, such that one filter at a time is selected.

Switching in one filter at a time offers the significant advantage of eliminating the filter interaction problems that otherwise might arise when two or more filters are connected together.

This separation of filters allows each filter in the set to be optimized individually without regard to the other filters in the set. On the other hand, the use of switches carries with it certain inherent disadvantages. For example, the input and output switches increase insertion loss and, as a general proposition, limit the signal power levels that can be practically accommodated. Furthermore passive intermodulation, PIM, in the switches may limit their usability in frequency division duplex (FDD) systems. Repeatability and reliability also may be compromised by the use of mechanical switches, particularly with higher signal powers and/or with frequent switch actuations.

SUMMARY

According to the teachings presented herein, a reconfigurable filter apparatus includes at least first and second passive filter sections connected in parallel to yield a composite filter response. Each passive filter section has a respective passband response and at least one of the passive filter sections is a "de-tunable" passive filter section. Each de-tunable passive filter circuit includes a detuning circuit operable to exclude the respective passband response of the de-tunable passive filter section from the composite filter response by detuning a resonator within the de-tunable passive filter section. In this context, "detuning" the resonator can be understood as short-circuiting the resonator, opening the resonator, or otherwise disabling the resonator, such that the filter path is blocked with respect to frequencies of interest.

Advantageously, the resonator that is selectively detuned in this manner is isolated from input and output ports of the de-tunable passive filter section with respect to frequencies outside of the respective passband response of the de-tunable passive filter section. That is, the detuning circuit operates on a resonator within the de-tunable passive filter section which is frequency-isolated from the other passive filter sections, such that disabling the de-tunable passive filter section, based on blocking its filter path via detuning of the resonator, does not substantially change the reactive loading seen by the other passive filter sections coupled in parallel.

In at least one embodiment, the reconfigurable filter apparatus comprises an antenna sharing filter in an antenna sharing feeder system, for use in a radio base station system. This application allows, for example, an operator to co-site two different communication systems, e.g., WCDMA system with a GSM system, and use one or more of the antenna sharing filters to allocate reconfigurable amounts of an overall bandwidth to the two systems.

Thus, in at least one embodiment of the reconfigurable filter apparatus, all or some number of the passive filter sections are configured to have contiguous passbands. As such, the bandwidth of the reconfigurable filter apparatus is reconfigurable in the sense that it is reduced (or expanded) by detuning (or not detuning) selected ones of the passive filter elements. Correspondingly, in at least one embodiment of the reconfigurable filter apparatus, the detuning circuits in the de-tunable passive filter sections are operative responsive to control signals, such that the composite filter response, e.g., the bandwidth, is reconfigurable as a function of control signal assertion.

However, the present invention is not limited to the above summary of features and advantages. Indeed, those skilled in the art will recognize additional features and advantages upon reading the following detailed description, and upon viewing the accompanying drawings.

DETAILED DESCRIPTION

Figure 1:
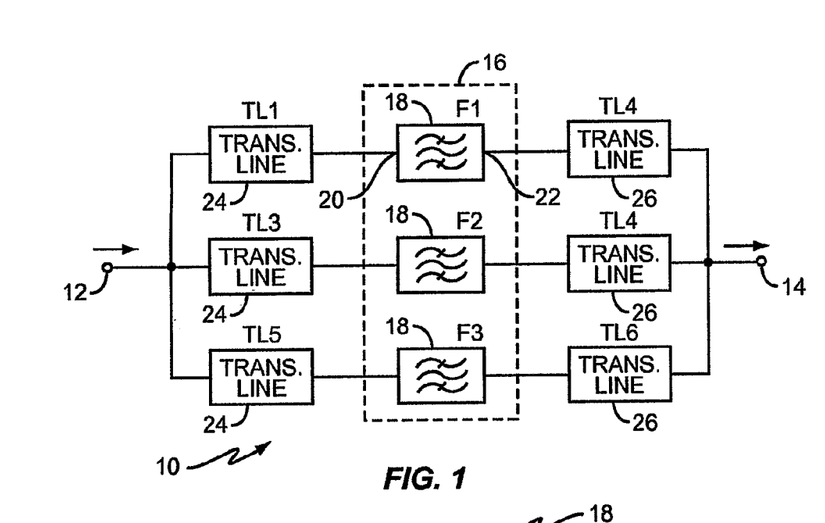
FIG. 1 is block diagram of one embodiment of a reconfigurable filter apparatus.

FIG. 1 illustrates one embodiment of a reconfigurable filter apparatus 10. The illustrated embodiment includes a common input port 12 and a common output port 14, with these input and output ports interconnected via a set 16 of passive filter sections 18. Each passive filter section includes an input port 20 that is coupled to the common input port 12, and an output port 22 that is coupled to the common output port 14. Optionally, the input port 20 of each passive filter section 18 couples to the common input port 12 through a phase shifter 24, which may be implemented as a transmission line having the desired impedance characteristics. Likewise, the output port 22 of each passive filter section 18 couples to the common output port 14 through a phase shifter 26, which likewise may be implemented as a transmission line segments or combinations of lumped reactive elements.

The respective phase shifters 24 and 26 for a given passive filter section 18, if used, may be configured to minimize reactive loading of each passive filter section 18 on the other passive filter sections 18. More particularly, for transmission-line implementations, the transmission lines for a given one of the passive filter sections 18 are configured to have lengths of approximately zero or a multiple of a half wavelength, if the passive filter section 18 exhibits a high impedance for frequencies outside of its passband. Conversely, if the passive filter section exhibits a low impedance for frequencies outside of its passband, its transmission lines are configured to have lengths approximately at an odd multiple of a quarter wavelength.

As a non-limiting example, FIG. 1 illustrates that the set 16 of passive filter sections 18 includes three passive filter sections 18, denoted as "F1," "F2," and "F3," with F1 coupled through transmission lines "TL1" and "TL2," F2 coupled through transmission lines "TL3" and "TL4," and F3 coupled through transmission lines "TL5" and "TL6." Those skilled in the art will appreciate that the transmission line couplings are optional, and may be omitted as needed or desired. Those skilled in the art will also appreciate that the set 16 of passive filter sections 18 can include a greater or lesser number than three passive filter sections shown in the illustration.

Figure 2:
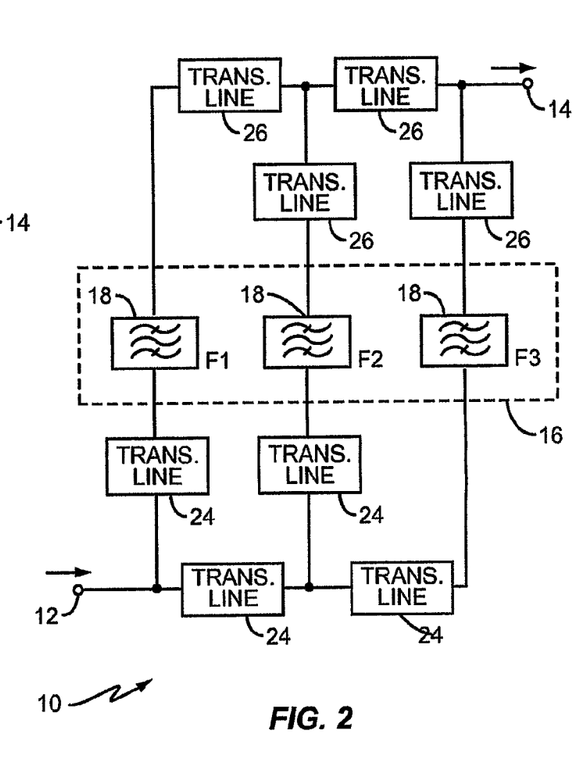
FIG. 2 is a block diagram of another embodiment of a reconfigurable filter apparatus.

An alternative way of connecting the passive filter sections 18 together in parallel is to use a manifold at the common input 12 and at the common output port 14. FIG. 2 depicts one embodiment of a manifold-based implementation of the reconfigurable filter apparatus 10. The advantage with this approach is that is avoids potential crowding of the input and output nodes where all the passive filter sections 18 connect to the same point.

Generally, the illustrated reconfigurable filter apparatus 10 is characterized by at least first and second passive filter sections 18 connected in parallel to yield a composite filter response, each passive filter section 18 having a respective passband response and at least one of the passive filter sections being a "de-tunable" passive filter section. In this sense, "de-tuning" a passive filter section 18 may be understood as deactivating it.

Figure 3:
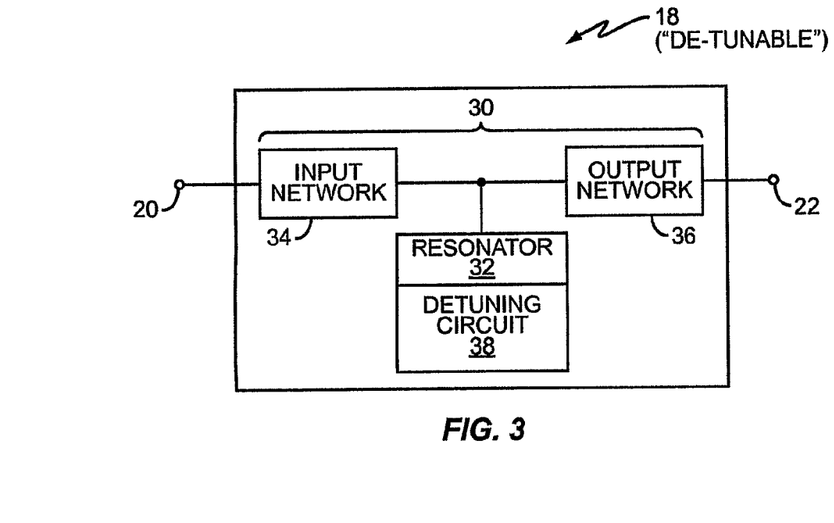
FIG. 3 is a block diagram of one embodiment of a "de-tunable" passive filter section, for use in a reconfigurable filter apparatus.

FIG. 3 illustrates a de-tunable version of a passive filter section 18, wherein a filter path 30 couples the filter section's input port 20 to its output port 22. One sees that a resonator 32 is disposed within the passive filter section 18, e.g., at an interior node or position along the filter path 30. More particularly, in the illustrated embodiment, an input network 34 isolates the resonator 32 from the input port 20, with respect to frequencies outside the passband of the passive filter section 18. Similarly, an output network 36 isolates the resonator 32 from the output port 22, with respect to frequencies outside the passband of the passive filter section 18.

With this input/output port isolation, a detuning circuit 38 can freely operate on the resonator 32, without substantially changing the reactive loading of the passive filter section 18 on the other passive filter sections 18 in the set 16. In other words, the resonator 32 operated on by the detuning circuit 38 is at an interior node or position within the filter path 30 that is isolated with respect to out-of-band frequencies. Thus, the resonator 32 can short-circuit or otherwise detune the resonator 32, so that it blocks the filter path 30 in its detuned state but does not interfere with the other passive filter sections 18 in the set 16. Indeed, with this configured frequency isolation, the frequency characteristics of any one of the passive filter sections 18 is relatively unchanged by detuning any one or more of the other passive filter sections 18.

With the above in mind, those skilled in the art will appreciate that one, two, some, or all of the passive filter sections 18 in a given reconfigurable filter apparatus 10 can be configured as de-tunable passive filter sections. Obviously, the extent to which the composite filter response can be reconfigured, and the nature of such reconfigurations, will depend on the respective passband responses of the passive filter sections 18 used to implement the reconfigurable passive filter apparatus 10, and on how many and which ones of those passive filter sections 18 are de-tunable.

Generally, each such passive filter section that is de-tunable includes some form of a detuning circuit 38, as illustrated in FIG. 3. The detuning circuit 38 is operable to exclude the respective passband response of the de-tunable passive filter section from the composite filter response by detuning a resonator 32 within the de-tunable passive filter section. Again, the configuration of the de-tunable passive filter section is such that the resonator 32 that is selectively detuned by the detuning circuit 38 is isolated from input and output ports 20 and 22 of the passive filter section 18 with respect to frequencies outside of the respective passband response of the passive filter section 18.

As provided by way of non-limiting example in FIG. 3, the resonator 32 is isolated from the input and output ports 20 and 22 of the passive filter section 18 by input and output networks 34 and 36 that substantially block frequencies outside of the respective passband of the passive filter section 18. Notably, these input and output "networks" 34 and 36 may simply comprise input-side and output-side portions of an overall passive filter circuit comprising the passive filter section 18.

Figures 4, 5:
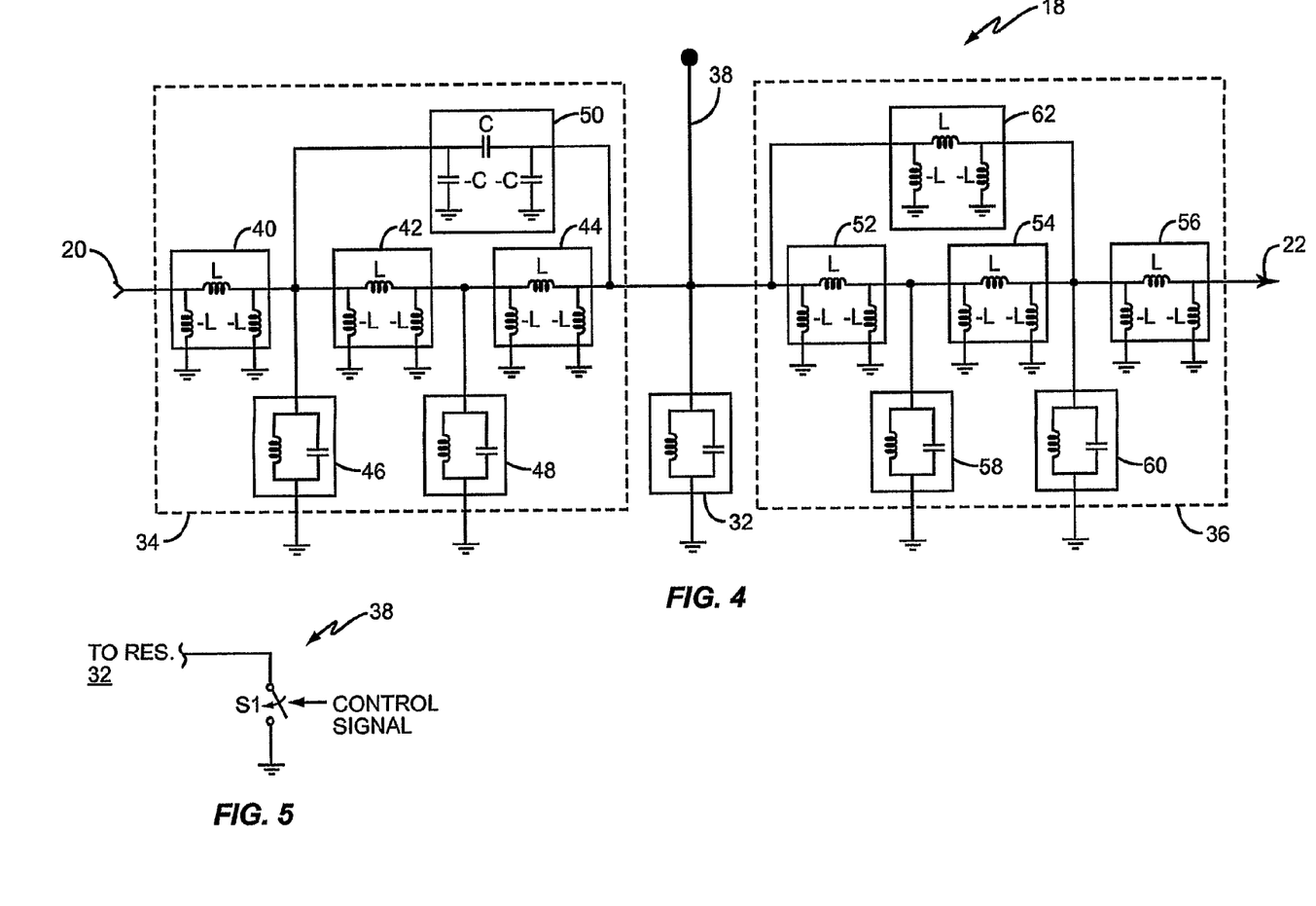
FIG. 4 is a schematic diagram of one embodiment of a de-tunable passive filter section.
FIG. 5 is a schematic diagram of one embodiment of a control circuit, for detuning a passive filter section.

Such an arrangement is illustrated in FIG. 4, wherein a central or otherwise interior resonator 32 is isolated from the input port 20 by an input network 34 that comprises series input coupling circuits 40, 42, and 44. Further, a resonator 46 is disposed between input coupler circuits 40 and 42, while a resonator 48 is disposed between input coupler circuits 42 and 44. A cross-coupler circuit 50 is optionally included, and spans the filter path 30 (see FIG. 3) across the input coupler circuits 42 and 44. In a similar arrangement, the resonator 32 is isolated from the output port 22 by an output network 36 that comprises series output coupler circuits 52, 54, and 56. A resonator 58 is positioned between the output coupler circuits 52 and 54, and a resonator 60 is likewise positioned between the output coupler circuits 54 and 56. Further, an optional cross-coupler circuit 62 spans the filter path 30 (see FIG. 3) across the output coupler circuits 52 and 54.

FIG. 4 thus provides an example passive filter section 18 having a filter path 30 with a total of five inductively coupled resonators and two cross-coupler circuits realizing FTZs (finite frequency transmission zeros). The central resonator 32 is "de-tuned" on a selective basis by operation of the detuning circuit 38, to block the filter path 30 and thereby remove or exclude the respective passband response of the passive filter section 18 from the composite filter response of the reconfigurable filter apparatus 10. De-tuning in this sense effectively switches out the passive filter section 18 from the parallel collection of passive filter sections 18, but does so without the insertion losses and other problems of a mechanical switch, and does so without unbalancing or otherwise changing the responses of the other passive filter sections 18 in the reconfigurable filter apparatus 10. De-tuning in this context thus encompasses short-circuiting or otherwise disabling the resonator 32.

As further noted regarding FIG. 4, it may be observed that the positions of the cross-coupler circuits 50 and 62 are chosen such that they do not bridge across the central resonator 32. Use of the cross-coupler circuits is helpful where one FTZ is needed at each side of the filter section's passband to achieve sufficient rejection close to the passband. As an alternative, the passive filter section 18 can use a quadruplet, where one capacitive cross-coupler circuit bypasses two resonators.

However, in such cases, the cross-coupler circuit would also bypass the central resonator 38, creating an unwanted narrow passband when the resonator is de-tuned. A possible counteraction would be to block the bypassing cross-coupler circuit simultaneously with blocking (detuning) the resonator 38, but such an arrangement would be more complicated than the illustrated embodiment.

Regardless, it should be understood that other filter circuit arrangements and architectures are contemplated herein for implementing the passive filter sections 18, and that the teachings herein are not, for example, limited to detuning a single resonator 38. There may be two or more frequency-isolated resonators operated on by one detuning circuit or a given passive filter section 18 may include more than one detuning circuit to operate on multiple resonators that are selectively detuned. Indeed, as used herein, "detuning a resonator" for the purpose of deactivating a given passive filter section 18 may be understood as detuning one or more resonators to effect the deactivation. Further, although the diagram is drawn using lumped resonators and impedance inverters, the passive filter section 18 may in practice be realized in a distributed arrangement, such as by using aperture-coupled coaxial quarter wave resonators, dielectric resonators, or any other resonator technology. With their high Q values, dielectric resonators may be particularly advantageous, in at least some applications.

Of course, other aspects of the reconfigurable filter apparatus 10 may be varied or adapted as needed or desired. For example, in at least one embodiment, the detuning circuit 38 is operable responsive to a control signal. The control signal may be dynamic, such as where the reconfigurable filter apparatus 10 is to be reconfigured during operation on a relatively frequent basis. In other embodiments, the control signals may be fixed for extended periods of time, such as by configuration settings or by setting default electrical connections. In any case, the detuning circuit (or circuits) 38 in a given passive filter section 18 selectively detune one or more resonators 32 within that passive filter section 18 responsive to a control signal. For example, assertion of a control signal causes the detuning circuit(s) 38 to short-circuit or open the resonator(s) 32.

FIG. 5 illustrates that one embodiment of the detuning circuit 38 comprises a switch or equivalent circuit element, which is operable to short-circuit a resonator 32 responsive to an applied control signal. More broadly, the detuning circuit 38 comprises at least a detuning control connection to the resonator 32. For example, the connection may be switched connection—which may include a detuning switch—that is switchable to an open (or closed) position for detuning, or the connection may be configured for applying a detuning signal that detunes the resonator 32. Interconnecting the detuning circuit 38 to the resonator 32 may include the use of a transmission line or other impedance matching element.

In another aspect regarding its configuration and its adaptability, the composite filter response of the reconfigurable filter apparatus 10 is determined by the respective passband responses of its included passive filter sections 18 and by the particular ones of which are detuned at any given time. In at least one embodiment, the reconfigurable filter apparatus 10 includes at least first and second passive filter sections 18, .e.g., filter sections F1 and F2, that are configured to have contiguous first and second passbands, respectively.

Considering only the first and second passive filter sections 18 for the moment, and assuming that both are de-tunable, those skilled in the art will appreciate that the composite bandwidth (BW) of the reconfigurable filter apparatus 10 is adjustable to be BW(F1) or BW(F2), or BW(F1+F2). These bandwidths respectively correspond to detuning just F2, detuning just F1, or detuning neither F1 nor F2. In at least one such contiguous passband embodiment, the first and second passive filter sections 18 are configured so that the first and second passbands overlap approximately at −3 dB roll off points in their respective passband responses.

Of course, the overlapping passband embodiment can be extended essentially to any number of passive filter sections 18. Thus, more broadly, the first and second passive filter sections 18 may be two among a plurality of (de-tunable) passive filter sections 18 having overlapping respective passbands. With this arrangement, the overall (composite) bandwidth of the reconfigurable filter apparatus 10 is reconfigurable based on detuning selected ones of the de-tunable passive filter sections 18.

Figure 6:
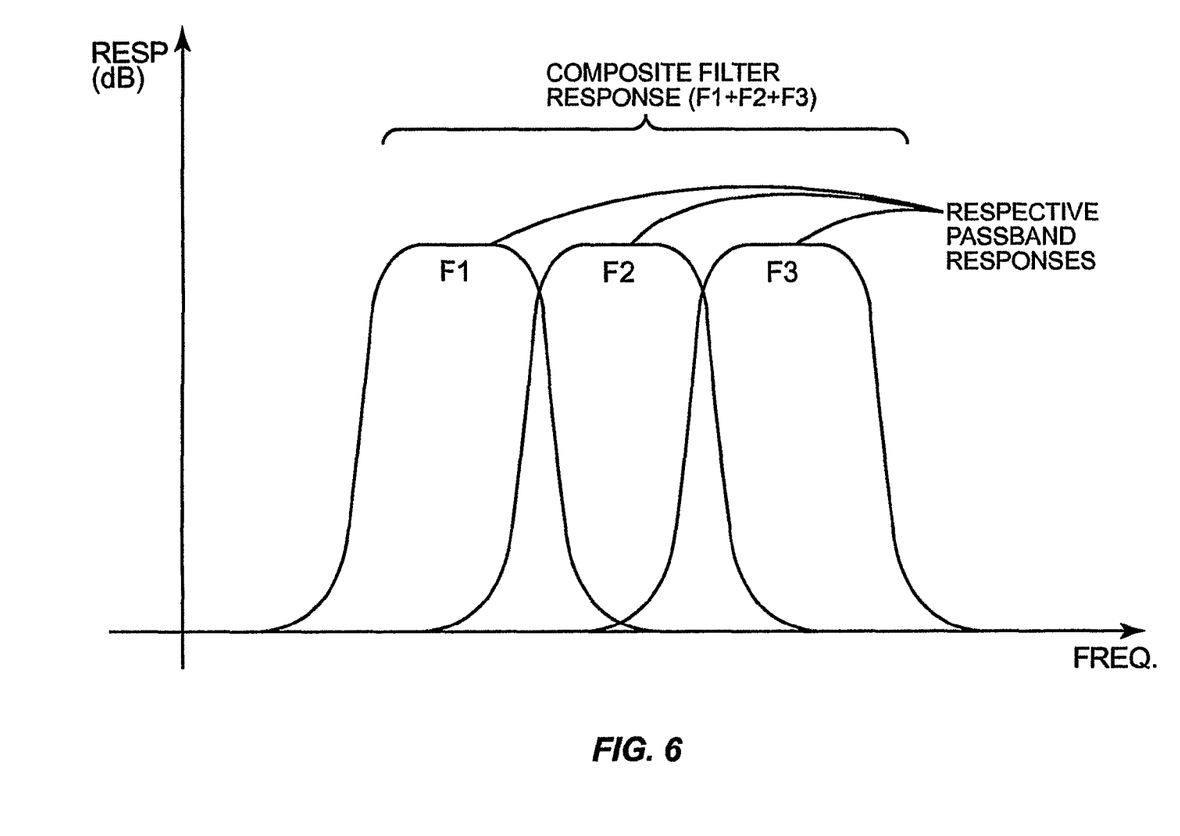
FIG. 6 is a plot of passband responses for an example set of passive filter sections, which may be implemented in a reconfigurable filter apparatus.

FIG. 6 illustrates a composite filter response for an embodiment of the reconfigurable filter apparatus 10 that includes three passive filter sections 18 (F1, F2, and F3) with overlapping passbands. Assuming that all of these passive filter sections 18 are individually de-tunable, the overall BW is reconfigurable to be BW(F1), BW(F2), BW(F3), BW(F1+F2), BW(F2+F3), BW(F1+F3) (notch configuration), and BW(F1+F2+F3). Of course, the overall center frequency of the composite filter also changes with these different BW configurations.

In the above example, one sees that the greatest bandwidth is obtained by not detuning any of the passive filter sections 18. That maximum bandwidth can be incrementally reduced on the low side by detuning F1 (or on the high side by detuning F3). Even non-contiguous passbands in the composite response are producible, such as by detuning F2. In any case, as noted, the detuning of a given passive filter section 18 is achieved by detuning one or more resonators within it.

As noted, the detuning of a resonator may entail shorting it, or may entail shifting its resonant frequency well away from the intended passband of the passive filter section 18 it resides in. For example, shifting the resonant frequency by 100 MHz may achieve the required detuning, where 100 MHz is large compared to the bandwidth of the passive filter section 18 containing the resonator being detuned. Regardless of the detuning details, the resonator(s) to detune are chosen to minimize the effect on the out-of-band reactive impedance of the passive filter section 18 being detuned. Doing so preserves good return loss in the composite passband for all combinations detuned/not-detuned passive filter sections 18.

As a potentially advantageous but non-limiting approach, the effect on return loss when detuning individual ones of the passive filter sections 18, or detuning combinations of them, is minimized by configuring the detuning circuit(s) 32 to operate on "interior" resonators as far away as possible from the points of multiplexing, i.e., the input and/or output ports 20 and 22. When the passive filter sections 18 are multiplexed at both ends, as shown in FIG. 1 for example, it is advisable to detune a resonator at the halfway point in the filter path 30 through a given passive filter section 18, assuming symmetrical frequency isolation looking either way from that point. This choice poses some restrictions on filter topology (cross couplings, etc.) unless more resonators or couplings also can be detuned.

In view of these teachings, those skilled in the art will appreciate that RF power within the activated pass-bands is rejected before it reaches the de-tuning circuits within the given passive filter sections 18. Hence power handling capability and PIM performance is not compromised by the de-tuning circuits as contemplated herein. PIM performance can be further improved by avoiding metal-to-metal contact, as only capacitive loading is needed to de-tune the interior resonator(s) within individual ones of the passive filter sections 18.

Of course, these and other aspects of the reconfigurable filter apparatus 10 taught herein may be adapted to the requirements of the particular application at hand. While its uses obviously are wide ranging, in an advantageous but non-limiting application, the reconfigurable filter apparatus 10 is incorporated into a radio base station system in a wireless communication network. In particular, one or more reconfigurable filter apparatuses 10 are used as filter banks in an antenna feeder system to allocate reconfigurable amounts of a total bandwidth to "co-sited" communication systems sharing the same antenna(s). Thus, in one or more embodiments, the reconfigurable filter apparatus 10 comprises an antenna sharing filter in an antenna sharing feeder system for a radio base station system. Here, the overall bandwidth of the antenna sharing filter is reconfigurable based on de-tuning selected ones of the de-tunable passive filter sections included in the antenna sharing filter.

Figure 7:
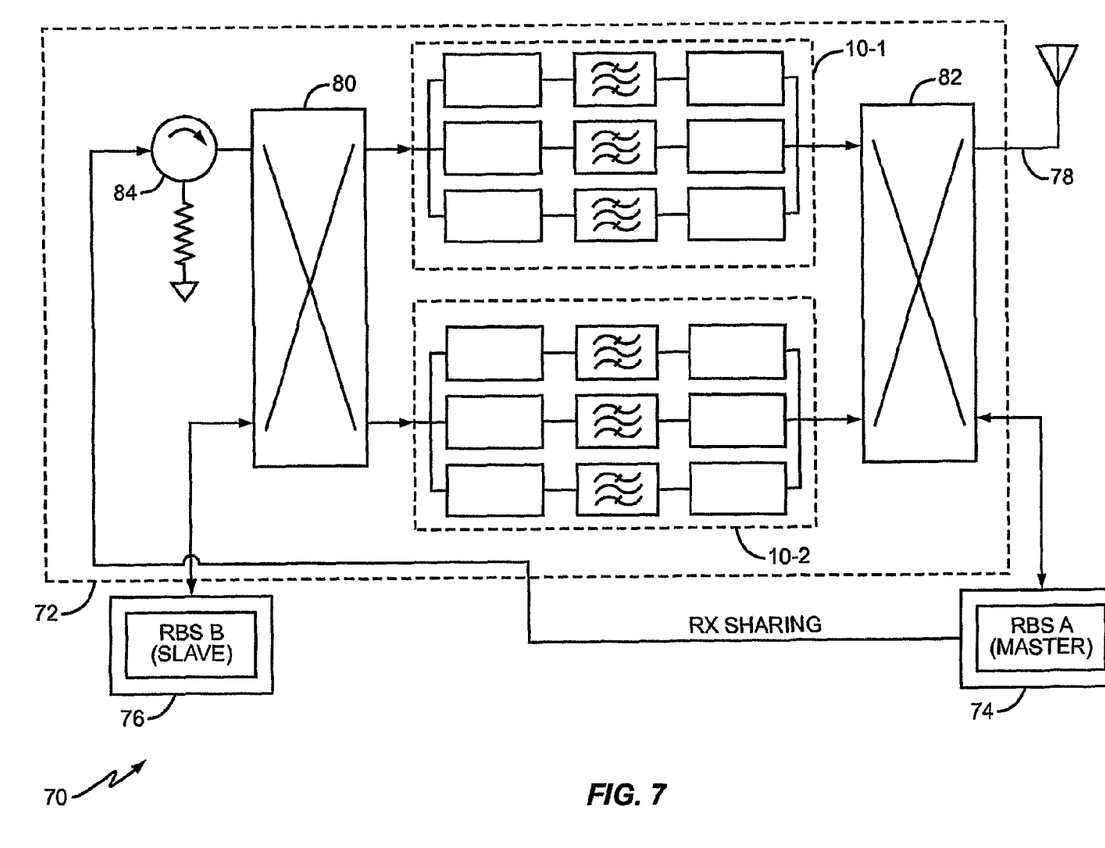
FIG. 7 is a block diagram of one embodiment of a radio base station system, which uses reconfigurable filter apparatuses as antenna sharing filters in an antenna sharing feeder system for system co-siting.

FIG. 7 illustrates a radio base station system 70, where an antenna sharing feeder system 72 enables two radio base stations 74 (RBS A) and 76 (RBS B) to share an antenna 78. Additional elements (e.g., couplers 80 and 82 and isolator 84) are shown for context. The two RBSs may be for different systems, e.g., GSM and LTE, and each one may be intended to use a portion of an overall frequency spectrum.

Here, reconfigurable filter apparatuses 10-1 and 10-2 are configured identically and used in conjunction with hybrids 80 and 82 (and isolator 84) to form complementary filter paths, providing a first passband between RBS A and the antenna 78 and a complementary second passband between RBS B and the antenna 78. "Complementary" in this sense means non-overlapping passbands within the overall spectrum of interest.

Figure 8:
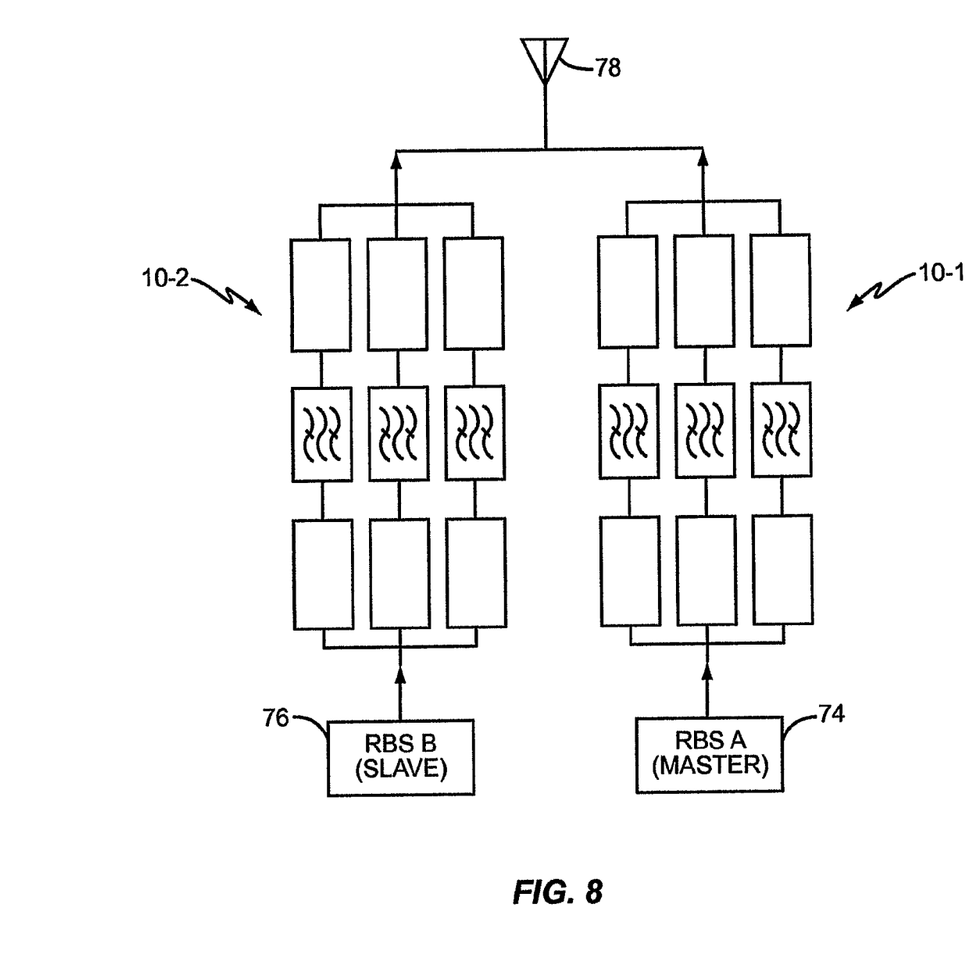
FIG. 8 is a block diagram of another co-siting embodiment.

FIG. 8 depicts another example arrangement where reconfigurable filter apparatuses 10 are used to directly duplex couple two paths to a common port. Unlike FIG. 7, wherein the reconfigurable filter apparatuses 10-1 and 10-2 had the same configuration, the reconfigurable filter apparatuses 10-1 and 10-2 in FIG. 8 are configured to pass different frequency bands.

For additional example details regarding feeder sharing and coupling details, one may refer to the published patent application WO 2006/121402, published on 16 Nov. 2006 and owned in common with the instant application. Further, those skilled in the art will appreciate that the teachings of FIGS. 7 and 8 can be applied to a variety of receiver (RX) and transmitter (TX) applications, and, more broadly, can be used in a variety of multiplexing applications.

For RBS co-siting as a particular example, the bandwidth allocated to one radio base station can be increased, while the bandwidth allocated to the other radio base station is correspondingly decreased. All such operations can be effected without need for replacing hardware, engaging in complex and/or labor intensive modifications, or providing complex mechanical/electromechanical apparatuses for filter retuning. The arrangement therefore is advantageous in co-sited systems where services are migrating away from one system and toward another, such as with the roll-out of LTE services alongside existing services. For example, an LTE system might be co-sited with an older system and initially be given a narrow band (2-5 MHz). Then, as the older system is phased out, its bandwidth could be decreased while the LTE system's bandwidth is increased (e.g., to 10-20 MHz). With the reconfigurable filter apparatus 10 taught herein, such migration is possible simply by reconfiguring one or more reconfigurable filter apparatuses 10 as appropriate.

Implementation of the reconfigurable filter apparatus 10 is, as was noted, based on passive components, either lumped or distributed. The passive implementation makes the reconfigurable filter apparatus 10 well suited for high power and/or high frequency applications, such as the above-described antenna sharing feeder system. Of course, those skilled in the art will recognize that use as non-limiting. Indeed, the present invention is not limited to the foregoing discussion and accompanying drawings. Instead, the present invention is limited only by the following claims and their legal equivalents.

What is claimed is:

1. A reconfigurable filter apparatus comprising:
    at least first and second passive filter sections connected in parallel to yield a composite filter response, each of the at least first and second passive filter sections having a respective passband response;
    a common input port;
    a common output port;
    a plurality of transmission lines;
    the at least first and second passive filter sections each being a de-tunable passive filter section having respective input and output ports, the input and output ports of each passive filter section being respectively coupled to the common input and output ports of the reconfigurable filter apparatus via respective ones of the plurality of transmission lines that are configured to minimize reactive loading of each passive filter section on the other passive filter sections;

the de-tunable passive filter sections further including:
- a resonator, the resonator being isolated from the input and output ports with respect to frequencies outside of the respective passband response of the corresponding de-tunable passive filter section; and
- a detuning circuit configured to exclude the respective passband response of the corresponding de-tunable passive filter section from the composite filter response by detuning the isolated resonator.

2. The reconfigurable filter apparatus of claim 1, wherein the de-tunable passive filter sections further include an input network and an output network; and the isolated resonator of each de-tunable passive filter section being isolated from the respective input and output ports of the corresponding de-tunable passive filter section by the respective input and output networks that substantially block frequencies outside of the respective passband of the de-tunable passive filter section.

3. The reconfigurable filter apparatus of claim 1, wherein the detuning circuit of each de-tunable passive filter section is configured to be responsive to a control signal.

4. The reconfigurable filter apparatus of claim 1, wherein the detuning circuit of each de-tunable passive filter section is configured to detune the respective isolated resonator by short-circuiting the corresponding isolated resonator or by opening the corresponding isolated resonator.

5. The reconfigurable filter apparatus of claim 1, wherein the detuning circuit of each de-tunable passive filter section comprises at least a detuning control connection to the respective isolated resonator.

6. The reconfigurable filter apparatus of claim 1, wherein the at least first and second passive filter sections are configured to have contiguous at least first and second passbands, respectively.

7. The reconfigurable filter apparatus of claim 6, wherein the at least first and second passive filter sections are configured such that the at least first and second passbands overlap approximately at −3 dB roll off points in their respective passband responses.

8. The reconfigurable filter apparatus of claim 6, wherein the at least first and second passive filter sections are two among a plurality of de-tunable passive filter sections having overlapping respective passbands, an overall bandwidth of the reconfigurable filter apparatus is reconfigurable based on detuning selected ones of the plurality of de-tunable passive filter sections.

9. The reconfigurable filter apparatus of claim 1, wherein the at least first and second passive filter sections are two among a plurality of de-tunable passive filter sections, such that the composite filter response is reconfigurable based on detuning selected ones of the plurality of de-tunable passive filter sections.

10. The reconfigurable filter apparatus of claim 1, wherein the at least first and second passive filter sections are a plurality of de-tunable passive filter sections having overlapping respective passbands; and the reconfigurable filter apparatus is an antenna sharing filter in an antenna sharing feeder system for a radio base station system, an overall bandwidth of the antenna sharing filter being reconfigurable based on de-tuning selected ones of the plurality of de-tunable passive filter sections included in the antenna sharing filter.

11. The reconfigurable filter apparatus of claim 1, wherein the plurality of transmission lines for a given one of the at least first and second passive filter sections are configured to have lengths of approximately either zero or and a multiple of a half wavelength, if the given one of the at least first and second passive filter sections exhibits a high impedance for frequencies outside of its passband, and are configured to have lengths approximately at an odd multiple of a quarter wavelength, if the given one of the at least first and second passive filter sections exhibits a low impedance for frequencies outside of its passband.

12. A reconfigurable filter apparatus comprising:
- a plurality of passive filter sections coupled in parallel to yield a composite filter response, each passive filter section having a respective passband response; and
- at least one passive filter section of the plurality of passive filter sections including a resonator configured to be selectively de-tuned to remove the respective passband response of the at least one passive filter section from the composite filter response, said resonator disposed in a filter path of the at least one passive filter section at a point that is isolated from frequencies outside of the respective passband of the at least one passive filter section, such that de-tuning the resonator blocks the filter path but does not substantially change reactive loading by the at least one passive filter section on the other passive filter sections of the plurality of filter sections.

* * * * *